(12) United States Patent
Huang et al.

(10) Patent No.: US 7,485,914 B2
(45) Date of Patent: Feb. 3, 2009

(54) INTERDIGITIZED CAPACITOR

(75) Inventors: Kai-Yi Huang, Taipei (TW); Chia-Jen Hsu, Taipei (TW); Len-Yi Lu, Hsinchu (TW)

(73) Assignee: Nuvoton Technology Corporation, Hsinchu (TW)

( * ) Notice: Subject to any disclaimer, the term of this patent is extended or adjusted under 35 U.S.C. 154(b) by 198 days.

(21) Appl. No.: 11/444,505

(22) Filed: Jun. 1, 2006

(65) Prior Publication Data

US 2007/0126078 A1    Jun. 7, 2007

(30) Foreign Application Priority Data

Dec. 7, 2005    (TW) .............................. 94143154 A

(51) Int. Cl.
  *H01L 27/108*    (2006.01)
  *H01L 29/76*     (2006.01)
  *H01L 29/94*     (2006.01)
  *H01L 31/119*    (2006.01)

(52) U.S. Cl. .................. 257/309; 257/307; 257/308

(58) Field of Classification Search .................. 257/307, 257/308, 309, 310
See application file for complete search history.

(56) References Cited

U.S. PATENT DOCUMENTS

| | | | | |
|---|---|---|---|---|
| 4,491,811 A * | 1/1985 | Niitsuma et al. | ............ | 333/151 |
| 6,230,566 B1 * | 5/2001 | Lee et al. | .................. | 73/514.32 |
| 6,653,681 B2 * | 11/2003 | Appel | .......................... | 257/307 |
| 6,949,811 B2 * | 9/2005 | Miyazawa | .................... | 257/532 |
| 2005/0077581 A1 * | 4/2005 | Chang et al. | .................. | 257/393 |
| 2007/0075397 A1 * | 4/2007 | Zhang | .......................... | 257/532 |

* cited by examiner

*Primary Examiner*—Phuc T Dang
(74) *Attorney, Agent, or Firm*—Muncy, Geissler, Olds & Lowe, PLLC

(57) ABSTRACT

An interdigitized capacitor comprising first and second electrodes. The first electrode comprises two combs symmetrical to a first mirror plane. The fingers of the combs extend toward the first mirror plane. The second electrode comprises two combs and a linear plate. The combs are symmetrical to a second mirror plane and the fingers thereof extend toward the second mirror plane. The linear plate is located at the second mirror plane and connected to one finger of the combs of the second electrode. The first and second mirror planes are orthogonal. The fingers of the combs of the first and second electrodes are interdigitized.

5 Claims, 19 Drawing Sheets

400

450

440

600

INTERDIGITIZED CAPACITOR

BACKGROUND OF THE INVENTION

1. Field of the Invention

The invention relates to capacitors in integrated circuits and, in particular, to interdigitized capacitors with bent fingers.

2. Description of the Related Art

Capacitors are essential passive elements in integrated circuits for radio-frequency (RF) and mixed-signal applications such as filters, oscillators, analog to digital (A/D) converters, digital to analog (D/A) converters, and so on. Conventional capacitors such as horizontal parallel plate or metal-insulator-metal (MIM) structure are typically formed with two parallel plates separated by an interlevel dielectric (ILD) layer. However, in order to obtain high capacitance density, additional process steps are required to form thin dielectric, and cost is thus increased.

FIG. 1 shows a conventional interdigitized capacitor formed with interdigitized conductive lines. The alternating bias applied to interdigitized lines induces line to line coupling capacitance. High capacitance density can be achieved without additional process due to short distances between the interdigitized lines. Various interdigitized capacitors with multi-level stacked structures were have been developed. FIG. 2 is a schematic diagram of an exemplary interdigitized capacitor with parallel conductive lines and FIG. 3 a schematic diagram of a multi-layer capacitor structure with alternately connected concentric lines. However, most conventional technology provides limited capacitance density. In addition, structures thereof exhibit high series parasitic resistance due to long conductive lines, causing quality factor degradation, especially at high frequencies.

In mixed signal technologies, thick top metal layer are typically used to reduce metal loss such that quality factor is improved, with line-to-line spacing of the top metal layer accordingly higher than that of other metal layers. Accordingly, the top metal layer is not a good choice for an interdigitized array due to lower coupling efficiency compared with MIM capacitors.

BRIEF SUMMARY OF THE INVENTION

The invention provides an interdigitized capacitor with lower series parasitic resistance. The invention not only improves quality but also provides higher capacitance density compared with conventional interdigitized capacitors.

An embodiment of an interdigitized capacitor according to the invention comprises first and second electrodes. The first electrode comprises two combs symmetrical to a first mirror plane. The fingers of the combs extend toward the first mirror plane. The second electrode comprises two combs and a linear plate. The combs are symmetrical to a second mirror plane and the fingers thereof extend toward the second mirror plane. The linear plate is located at the second mirror plane and connected to one finger of the combs of the second electrode. The first and second mirror planes are orthogonal. The fingers of the combs of the first and second electrodes are interdigitized.

An embodiment of a stacked capacitor comprises a plurality of the disclosed interdigitized capacitors. Each interdigitized capacitor has the same structures as the others and an angle difference of 90° from the closest interdigitized capacitor. The first and second electrodes have opposing polarities.

An embodiment of an integrated stacked capacitor comprises the disclosed stacked capacitor and a MIM capacitor. The stacked capacitor comprises a plurality of the disclosed interdigitized capacitors and is connected with the MIM capacitor in parallel. Each interdigitized capacitor in the stacked capacitor has the same structures as the others and an angle difference of 90° from the closest interdigitized capacitor. The first and second electrodes have opposing polarities.

The invention provides a interdigitized capacitor such that high frequency signals enter the interdigitized capacitor from both sides thereof. Thus, series parasitic resistance is reduced and quality factor improved. In addition, high capacitance density can be achieved. Utilization of silicon area is improved by disposing devices under the interdigitized capacitor.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the subsequent detailed description and the accompanying drawings, which are given by way of illustration only, and thus are not limitative of the present invention, and wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
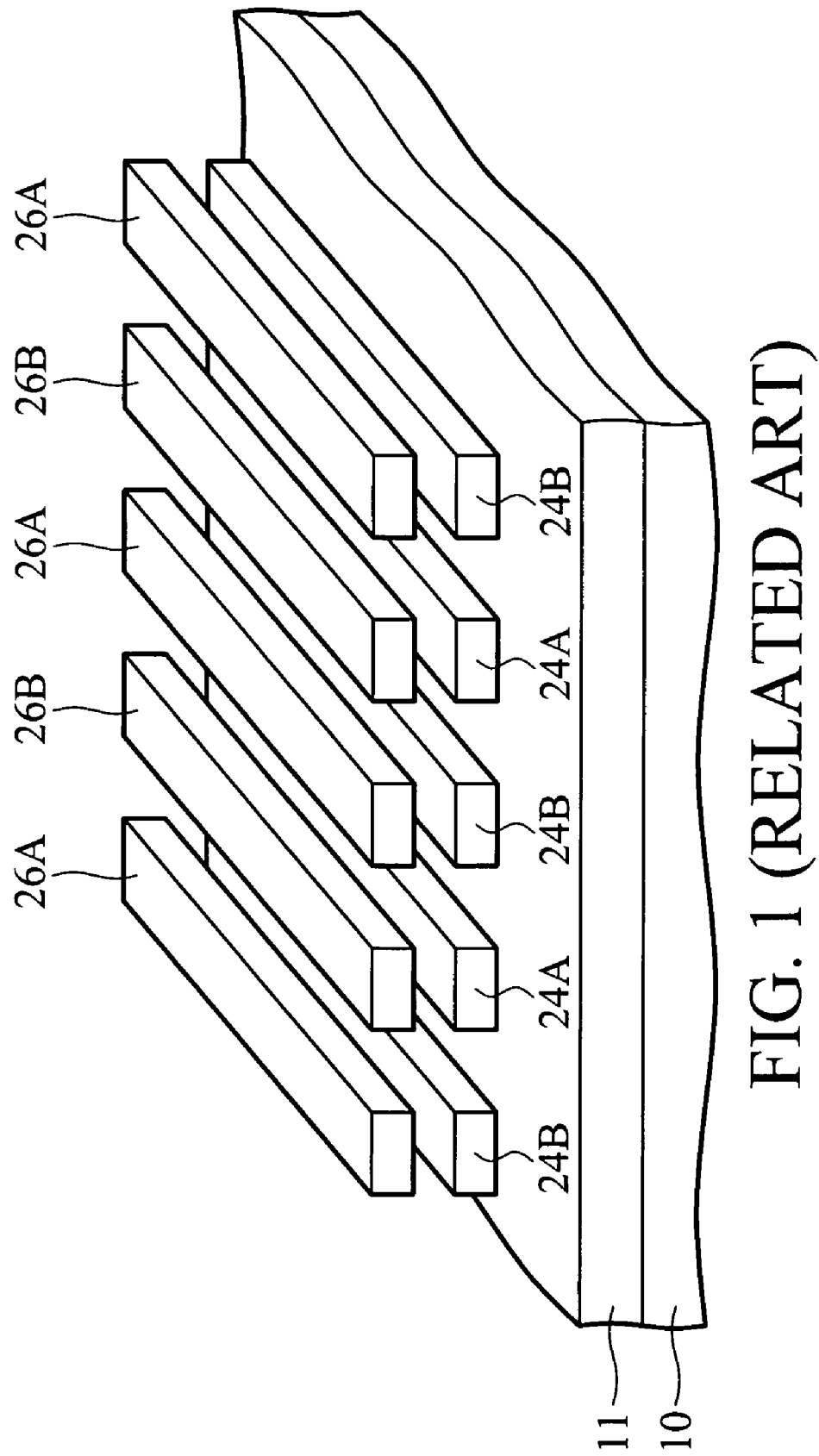
FIG. 1 shows a conventional interdigitized capacitor formed with interdigitized conductive lines.
Figure 2:
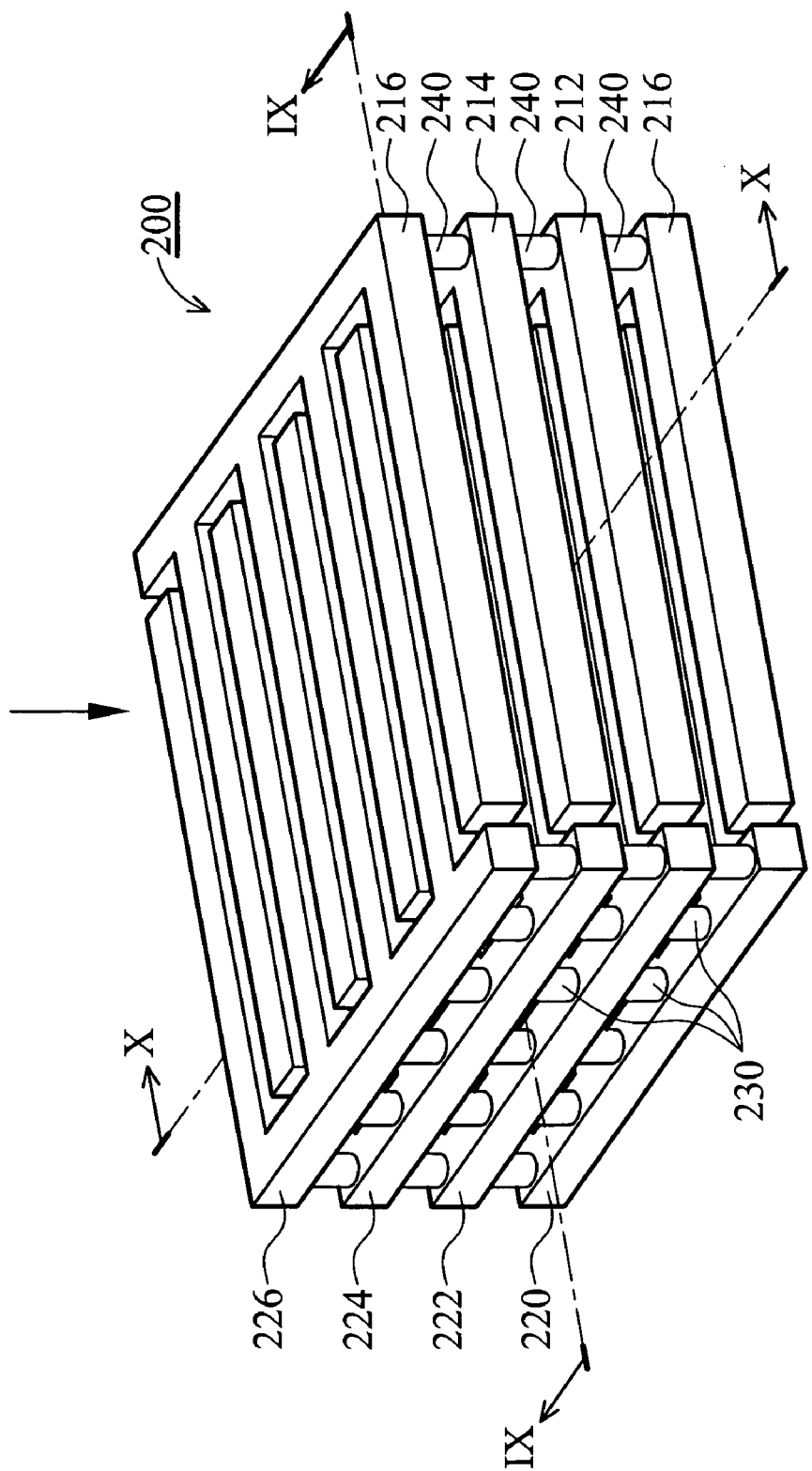
FIG. 2 is a schematic diagram of an interdigitized capacitor with parallel conductive lines.
Figure 3:
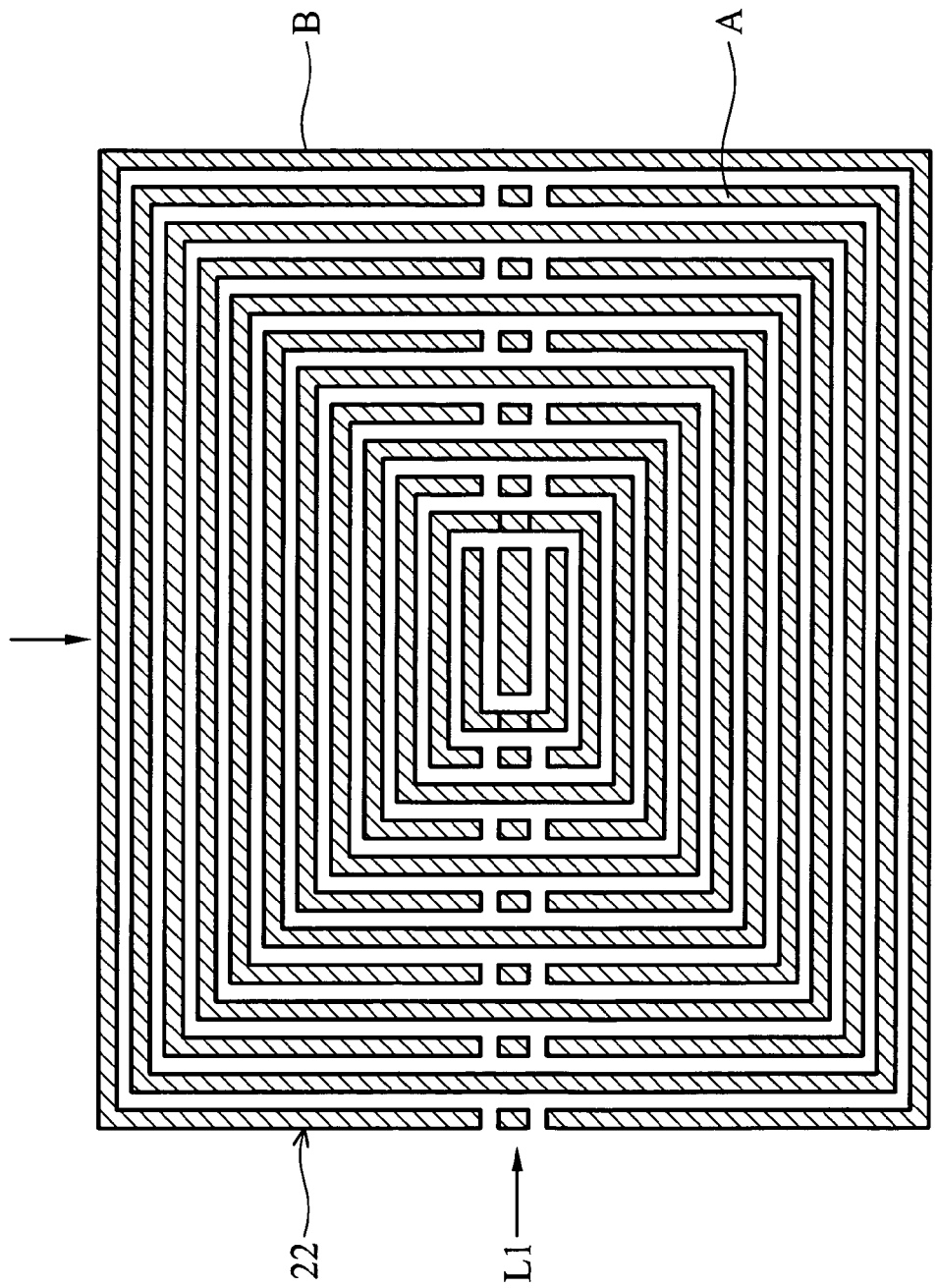
FIG. 3 is a schematic diagram of a multi-layer capacitor structure with alternately connected concentric lines
Figure 4A:
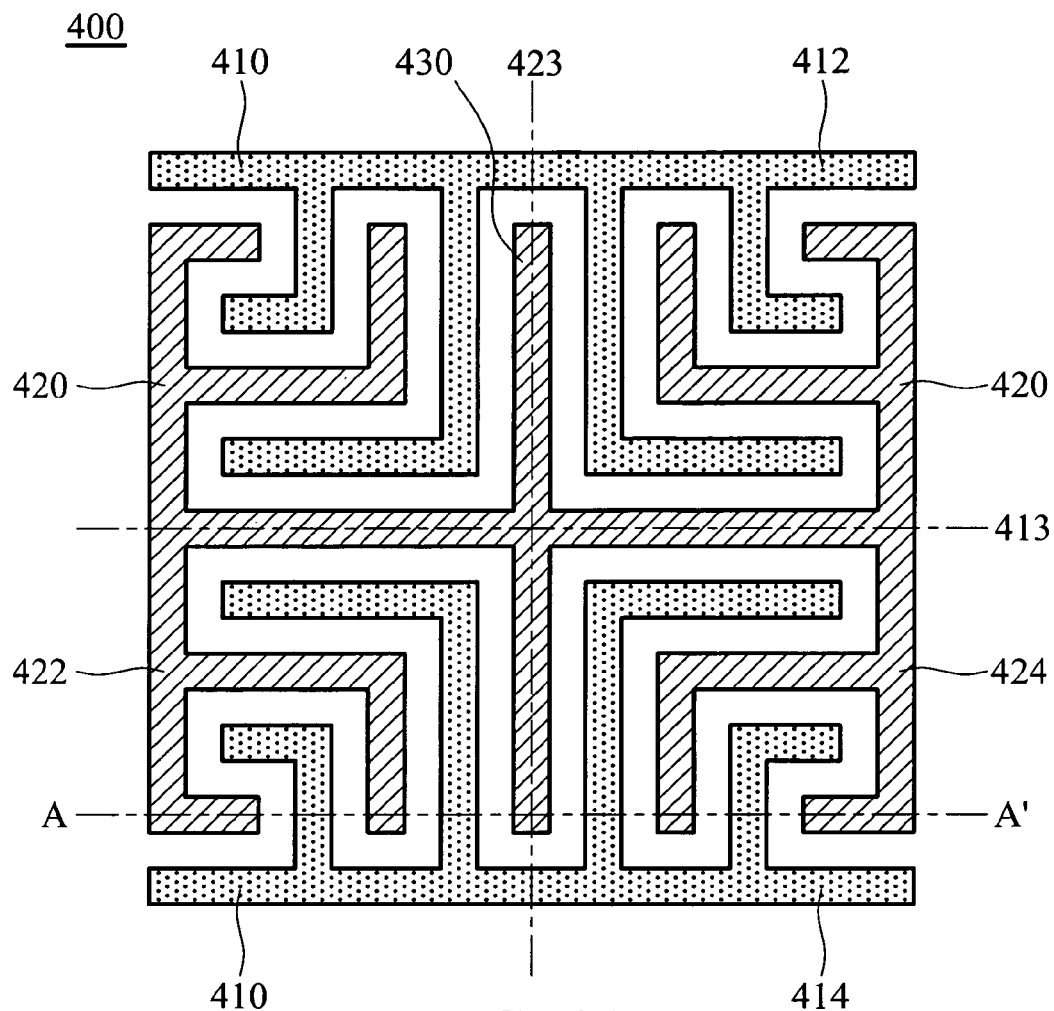
FIG. 4A is a top view of an interdigitized capacitor according to an embodiment of the invention.
Figure 4B:
FIG. 4B is a cross section of the interdigitized capacitor in FIG. 4A along a dashed line A-A'.
Figure 5A:
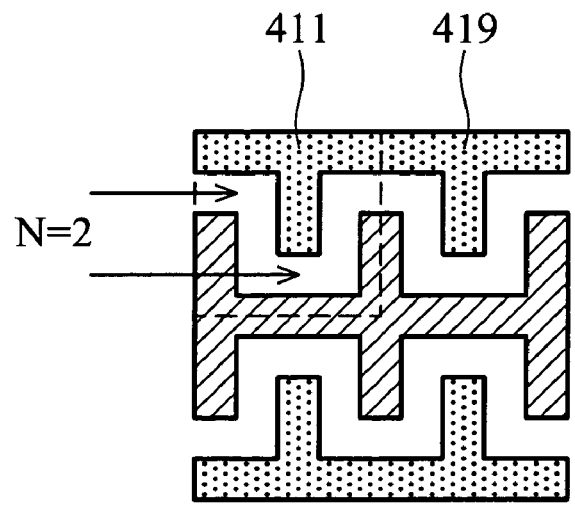
FIGS. 5A to 5E illustrate varieties of an interdigitized capacitor according to an embodiment of the invention.
Figure 5B:
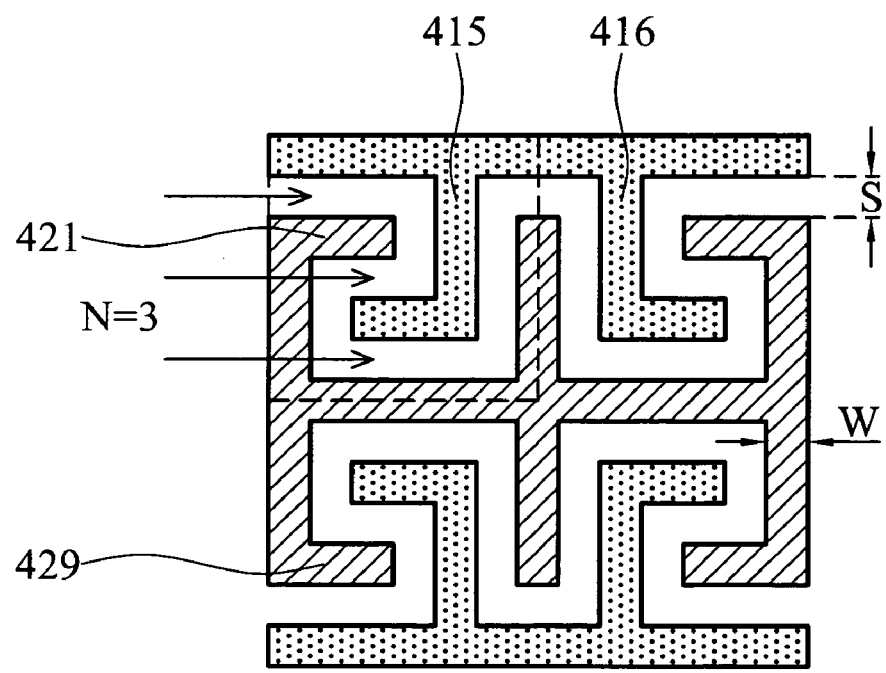
Figure 5C:
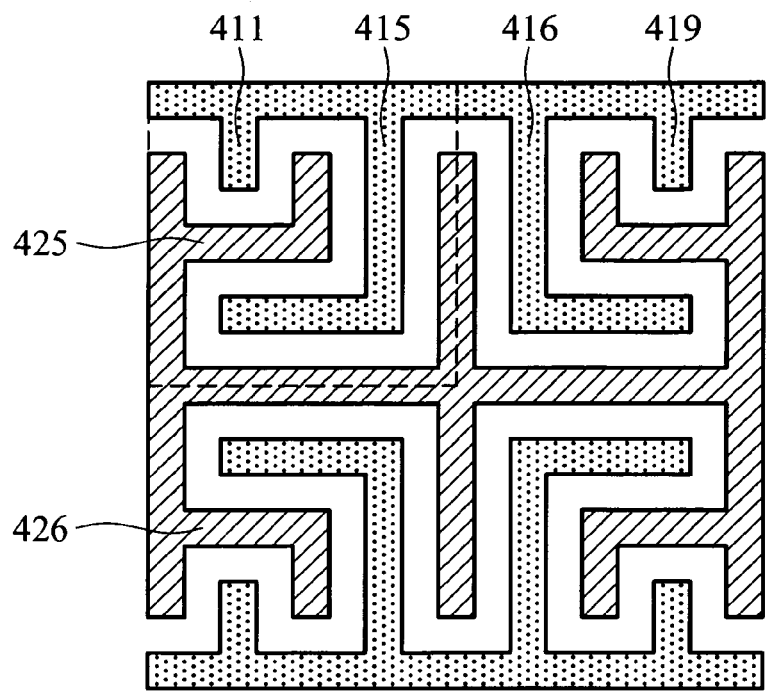
Figure 5D:
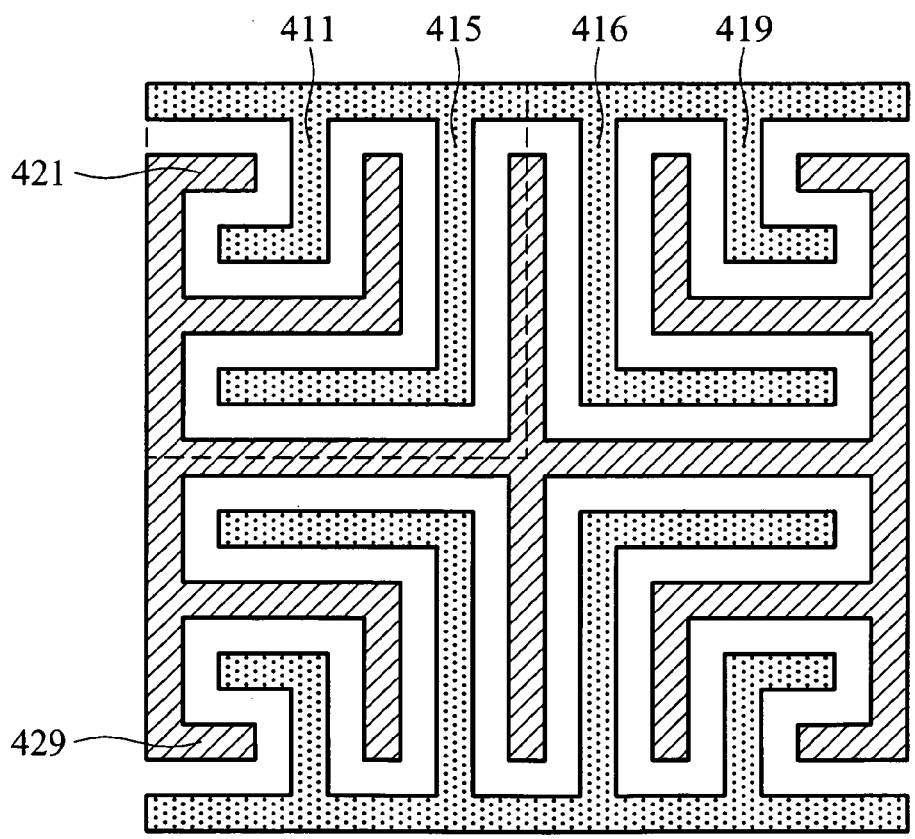
Figure 5E:
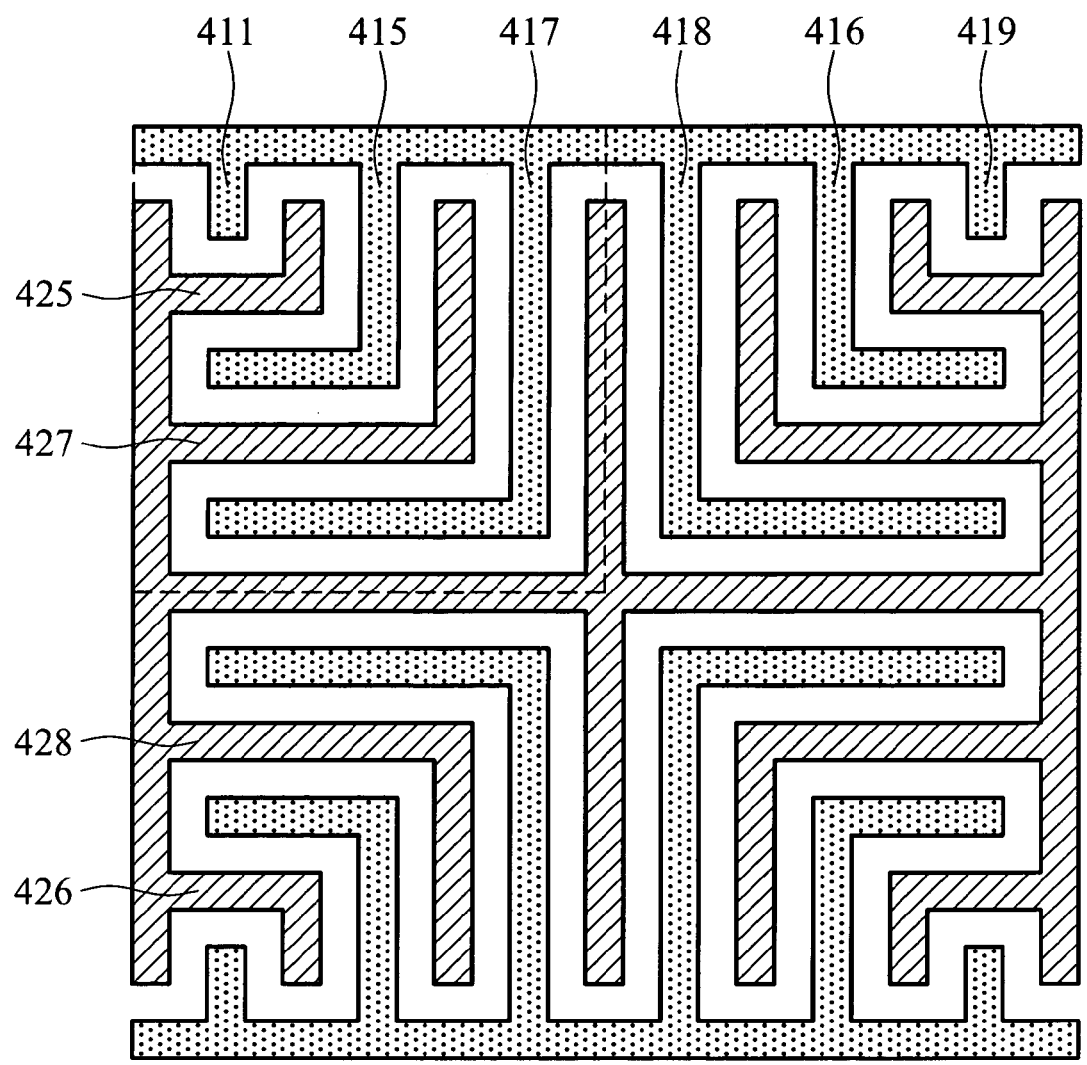

FIG. 4A is a top view of an interdigitized capacitor according to an embodiment of the invention and FIG. 4B a cross section thereof along a dashed line A-A'. The interdigitized capacitor 400 comprises a first electrode 410 and a second electrode 420. The first electrode 410 comprises two combs 412 and 414. The combs 412 and 414 are symmetrical to a first mirror plane 413. The fingers of the combs 412 and 414 extend toward the first mirror plane 413. The second electrode 420 comprises two combs 422 and 424 and a linear plate 430. The combs 422 and 424 are symmetrical to a second mirror plane 423 and the fingers thereof extend toward the second mirror plane 423. The linear plate 430 is located at the second mirror plane 423 and connected to one finger of the combs of the second electrode 420. In FIG. 4A, the combs respectively have odd fingers and the middle fingers thereof are connected with the linear plate 430. The first mirror plane 413 and the second mirror plane 423 are orthogonal. The fingers of the combs of the first electrode 410 and the second electrode 420 are interdigitized. When the first electrode 410 and the second electrode 420 have a voltage difference or opposing polarities, capacitance is induced there between. For simplicity of capacitor design, spacing between fingers of the first electrode 410 and the second electrode 420 can be fixed. The interdigitized capacitor 400 thus forms a square.

FIGS. 5A to 5E illustrate varieties of an interdigitized capacitor according to an embodiment of the invention. The interdigitized capacitors are divided into four blocks due to symmetry thereof. The character "N" is a number of spacing of the interdigitized capacitor in each block, the character "S" a spacing distance, and the character "W" a metal line width.

The first electrode of the interdigitized capacitor comprises top and bottom combs with even fingers. When the spacing number per block "N" is even for the top comb, for example, N=2, 4, 6, . . . , the top comb has (N−2) bent fingers and 2 linear fingers. The linear fingers are respectively located on one and the other sides of the bent fingers, wherein length of the linear fingers is "S+W". The first bent finger 415 bends left with an end thereof aligned with a left edge of the left linear finger 411. Spacing between the first bent finger 415 and the left linear finger 411 is 2S+W. The second bent finger 416 bends right with an end thereof aligned with a right edge of the right linear finger 419. Spacing between the second bent finger 416 and the right linear finger 419 is 2S+W. The third bent finger 417 bends left with an end thereof aligned with the left edge of the left linear finger 411. Spacing between the first bent finger 415 and the third bent finger 417 is 2S+W. The fourth bent finger 418 bends right with an end thereof aligned with the right edge of the right linear finger 419. Spacing between the second bent finger 416 and the fourth bent finger 418 is 2S+W. Other cases in which the spacing number N is even can be deduced by analogy. The left and right linear fingers exist in the interdigitized capacitor when the spacing number N is even. When the spacing number N is 2, there is no bent finger. First and second bent fingers exist in the interdigitized capacitor when the spacing number N is 4 and first, second, third, and fourth bent fingers exist when the spacing number N is 6. Other cases in which the spacing number N is even can be deduced by analogy.

When the spacing number per block "N" is odd for the top comb, for example, N=3, 5, 7, . . . , the top comb has (N−1) bent fingers and no linear fingers on both sides. The first bent finger 415 bends left with a distance S+W between an end and a left edge thereof. The second bent finger 416 bends right with a distance S+W between an end and a right edge thereof. The third bent finger 417 bends left with an end thereof aligned with the end of the first bent finger 415. Spacing between the first bent finger 415 and the third bent finger 417 is 2S+W. The fourth bent finger 418 bends right with an end thereof aligned with the end of the second bent finger 416. Spacing between the second bent finger 416 and the fourth bent finger 418 is 2S+W. Other cases in which the spacing number N is odd can be deduced by analogy. The left and right linear fingers do not occur in the interdigitized capacitor when the spacing number N is odd. There are first and second bent fingers in the interdigitized capacitor when the spacing number N is 3 and first, second, third, and fourth bent fingers when the spacing number N is 5. Other cases in which the spacing number N is odd can be deduced by analogy.

Structure of the bottom comb 414 is the same as the top comb 412. The top comb 412 and the bottom comb 414, however, are symmetrical to the first mirror plane 413. In addition, all the fingers extend toward the first mirror plane 413. As a result, the top comb 412 and the bottom comb 414 collectively form the first electrode 410.

The second electrode of the interdigitized capacitor comprises left and right combs with odd fingers. In order to bend the fingers toward up and down symmetrically, the middle fingers of the left and right combs are connected with the linear plate 430 such that a cross structure is formed at the center of the second electrode.

When the spacing number per block "N" is even for the left comb 422, for example, N=2, 4, 6, . . . , the left comb 422 has (N−2) bent fingers on both sides of the middle finger. The first bent finger 425 bends upward with a distance S+W between an end and a top edge thereof. The second bent finger 426 bends downward with a distance S+W between an end and a bottom edge thereof. The third bent finger 427 bends upward with an end thereof aligned with the end of the first bent finger 425. Spacing between the first bent finger 425 and the third bent finger 427 is 2S+W. The fourth bent finger 428 bends downward with an end thereof aligned with the end of the second bent finger 426. Spacing between the second bent finger 426 and the fourth bent finger 428 is 2S+W. Other cases in which the spacing number N is even can be deduced by analogy. The left and right linear fingers do not exist in the interdigitized capacitor when the spacing number N is 2. There are first and second bent fingers in the interdigitized capacitor when the spacing number N is 4 and first, second, third, and fourth bent fingers when the spacing number N is 6. Other cases in which the spacing number N is even can be deduced by analogy.

When the spacing number per block "N" is odd for the left comb 422, for example, N=3, 5, 7, . . . , the left comb 422 has (N−3) bent fingers and 2 linear fingers. The bent fingers are located on one and the other sides of the middle finger, and the linear fingers respectively on one and the other sides of the bent fingers. The first bent finger 425 bends upward with an end thereof aligned with a top edge of the top linear finger 421. Spacing between the first bent finger 425 and the top linear finger 421 is 2S+W. The second bent finger 426 bends downward with an end thereof aligned with a bottom edge of the bottom linear finger 429. Spacing between the second bent finger 426 and the bottom linear finger 429 is 2S+W. The third bent finger 427 bends upward with an end thereof aligned with the top edge of the top linear finger 421. Spacing between the first bent finger 425 and the third bent finger 427 is 2S+W. The fourth bent finger 428 bends downward with an end thereof aligned with the bottom edge of the bottom linear finger 429. Spacing between the second bent finger 426 and the fourth bent finger 428 is 2S+W. Other cases in which the spacing number N is odd can be deduced by analogy. The top and bottom linear fingers occur in the interdigitized capacitor when the spacing number N is odd. When the spacing number N is 3, there is no bent finger. There are first and second bent fingers in the interdigitized capacitor when the spacing number N is 5 and first, second, third, and fourth bent fingers when the spacing number N is 7. Other cases in which the spacing number N is odd can be deduced by analogy.

Figure 6A:
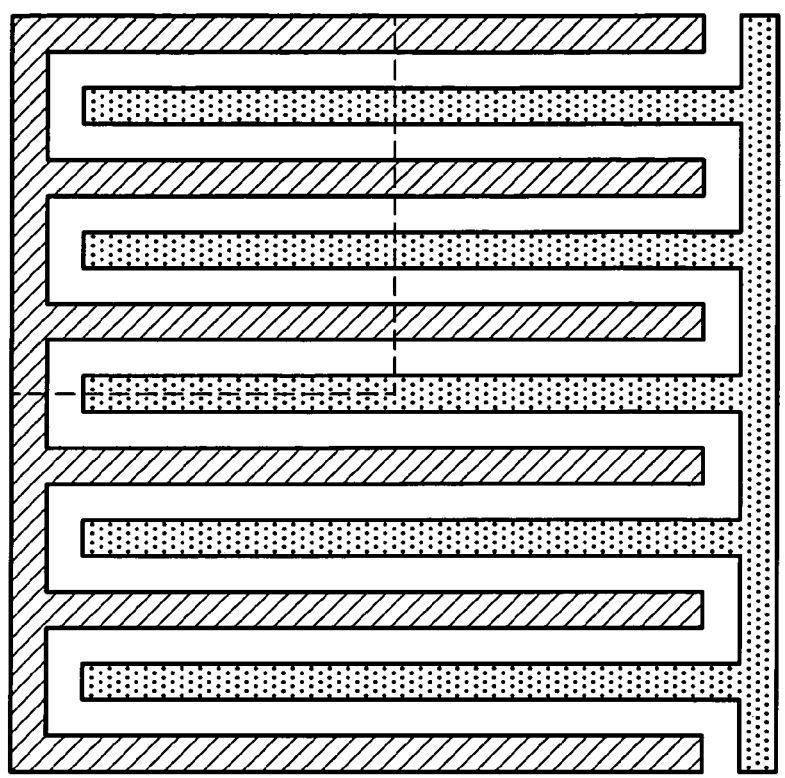
FIGS. 6A and 6B respectively show a conventional interdigitized capacitor and an interdigitized capacitor according to an embodiment of the invention with area of the interdigitized capacitors the same.
Figure 6B:
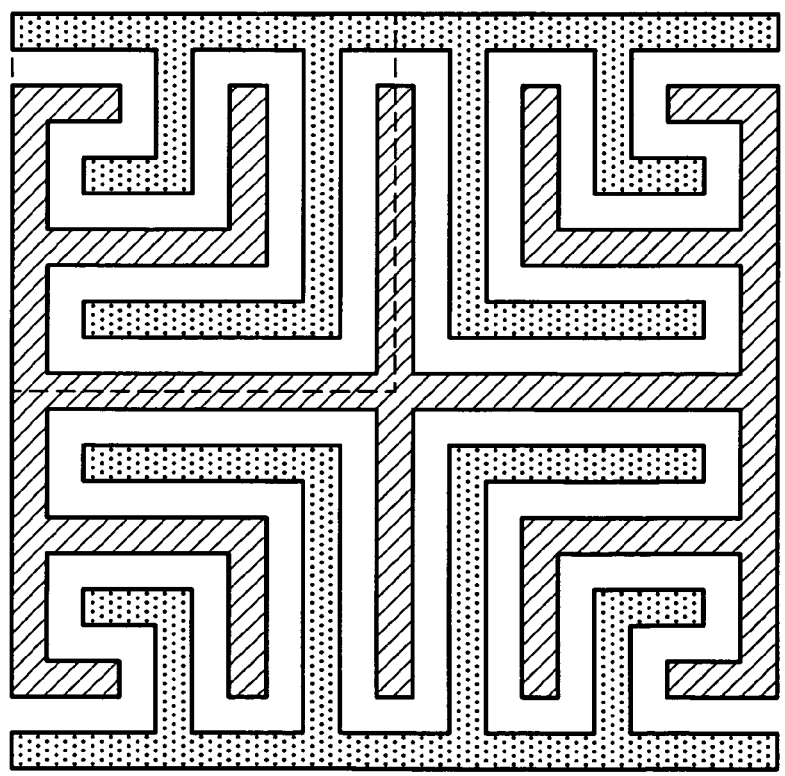

FIGS. 6A and 6B respectively show a conventional interdigitized capacitor and an interdigitized capacitor according to an embodiment of the invention with area of the interdigitized capacitors the same. From deduction, a coupling length Lh1 of a conventional interdigitized capacitor is expressed as $L_{h1}=W+(S+W)\times 4N^2$ and a coupling length Lh2 of the interdigitized capacitor according to an embodiment of the invention as $L_{h2}=(W/2+(S+W)\times N^2)\times 4=2W+(S+W)\times 4N^2$. Area of both interdigitized capacitors is $[W+(S+W)\times N\times 2]^2$. From comparison of the coupling lengths Lh1 and Lh2, it is found that the interdigitized capacitor according to the invention is provided with almost the same or even higher capacitance density than the conventional interdigitized capacitor.

Figure 7A:
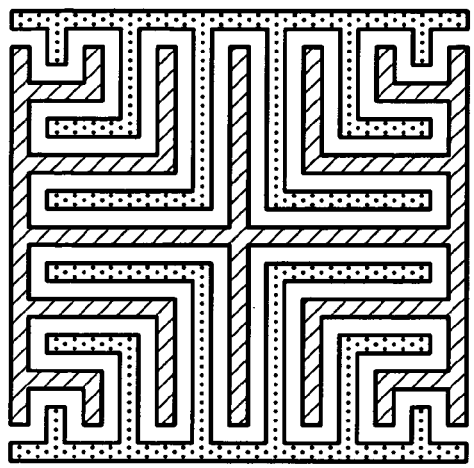
FIG. 7A shows an interdigitized capacitor 400 in the first metal layer in the stacked capacitor.
Figure 7C:
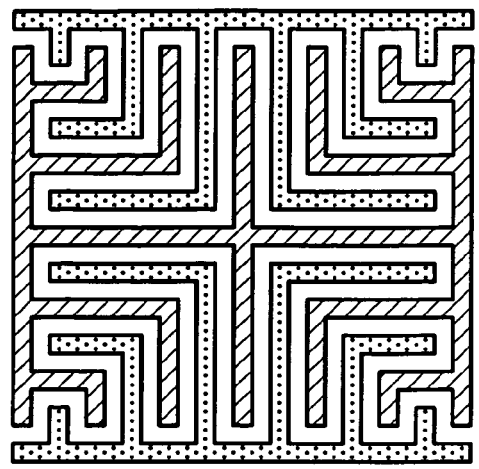
FIG. 7C shows an interdigitized capacitor 450 in the third metal layer in the stacked capacitor.
Figure 7B:
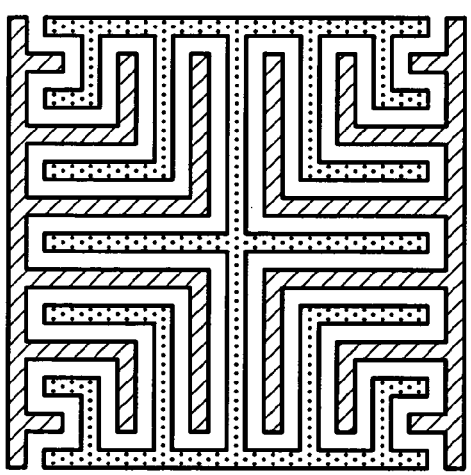
FIG. 7B shows an interdigitized capacitor 440 in the second metal layer in the stacked capacitor.
Figure 7D:
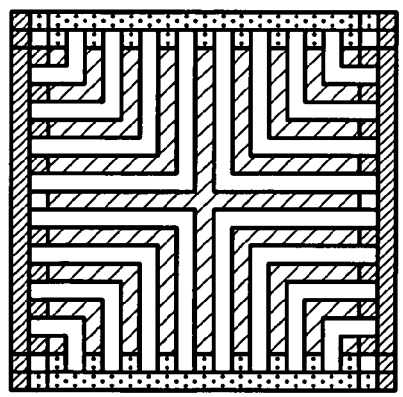
FIG. 7D is a top view of overlay of the interdigitized capacitors in the stacked capacitor.

In order to increase capacitance density, a stacked capacitor according to a second embodiment of the invention is provided and shown in FIGS. 7A-7D. The stacked capacitor is formed with x metal layers. Each metal layer includes a disclosed interdigitized capacitor. In the stacked capacitor, each interdigitized capacitor has the same structure as the others and an angle difference of 90° from the closest interdigitized capacitor. The first and second electrodes have opposing polarities. FIG. 7A shows an interdigitized capacitor 400 in the first metal layer in the stacked capacitor and FIG. 7B an interdigitized capacitor 440 in the second metal layer. Structure of the interdigitized capacitors 400 and 440 is the same. However, there is an angle difference of 90° between the interdigitized capacitors and the polarities of the first and second electrodes are exchanged. FIG. 7C shows an interdigitized capacitor 450 in the third metal layer in the stacked capacitor. Structure thereof is the same as the interdigitized capacitors 400 and 440. However, there is an angle difference of 180° from the interdigitized capacitor 400 and the polarities of the first and second electrodes are exchanged again. The remaining interdigitized capacitors can be deduced by analogy. Structure of the interdigitized capacitor in the xth metal layer is the same as the others. However, there is an angle difference of (x−1)×90° from the interdigitized capacitor 400 and polarities of the first and second electrodes are exchanged again from polarities of the interdigitized capacitor in the (x−1)th metal layer. This arrangement provides effective coupling between adjacent metal lines within the same metal layer and in different layers. FIG. 7D is a top view of overlay of the interdigitized capacitors in the stacked capacitor. From deduction, total coupling length between the metal lines in different layers is expressed as $$L=\lfloor W/4+W\times(N-1)-(S+W)\times(N-1)^2 \rfloor\times W\times 4\times(x-1).$$

Figure 8A:
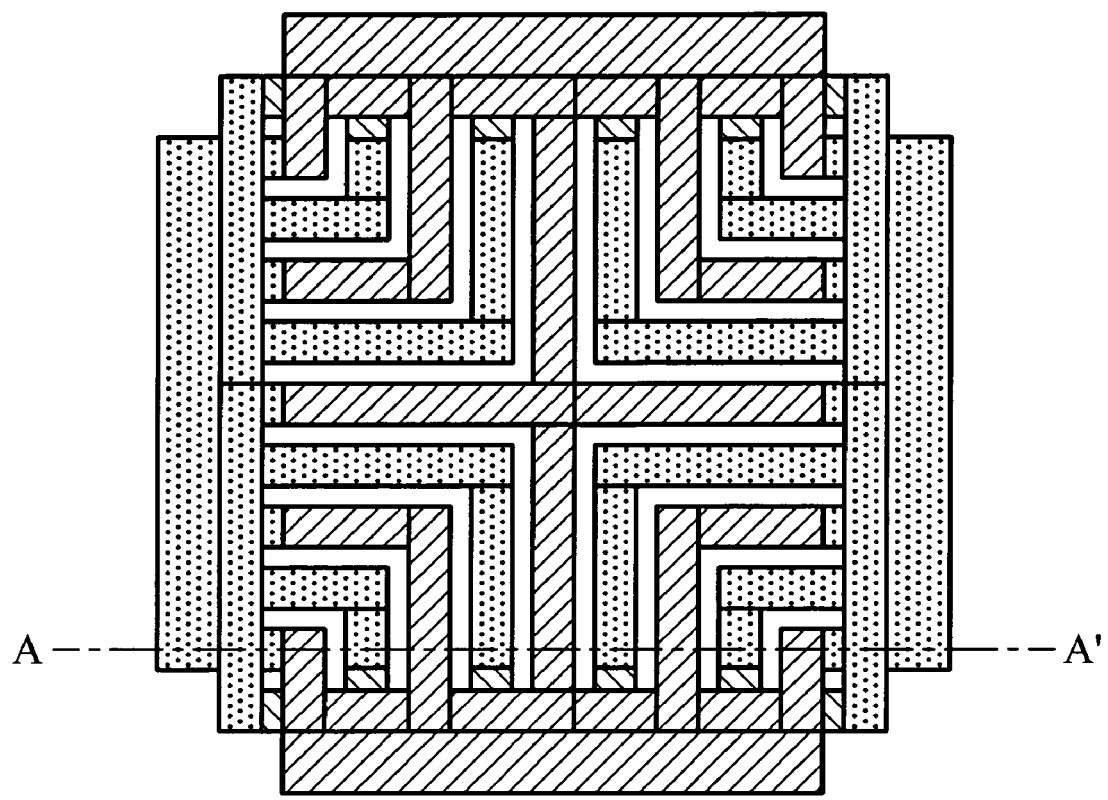
FIG. 8A is a top view of a 3-level interdigitized capacitor according to the second embodiment of the invention.
Figure 8B:
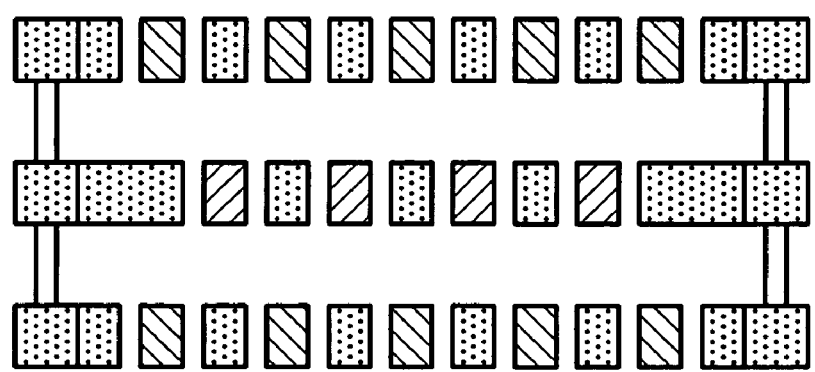
FIG. 8B is a cross section of the 3-level interdigitized capacitor in FIG. 8A along a dashed line A-A'.
Figure 9A:
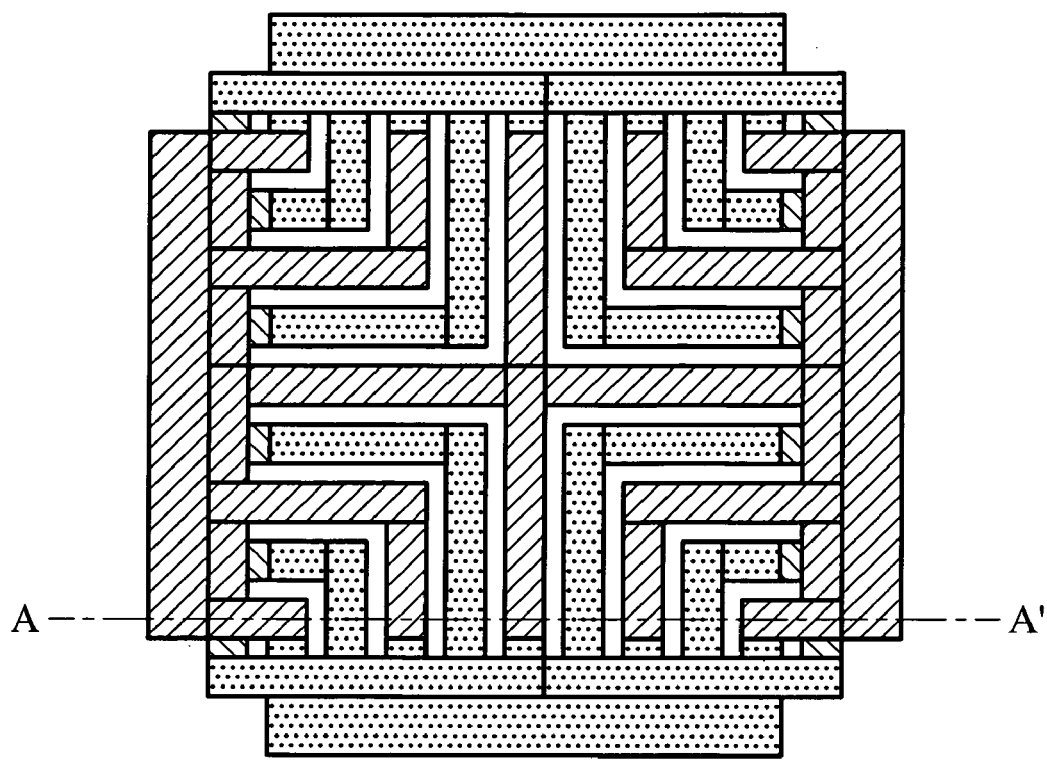
FIG. 9A is a top view of the 3-level interdigitized capacitor in FIG. 8A rotated by 90°.
Figure 9B:
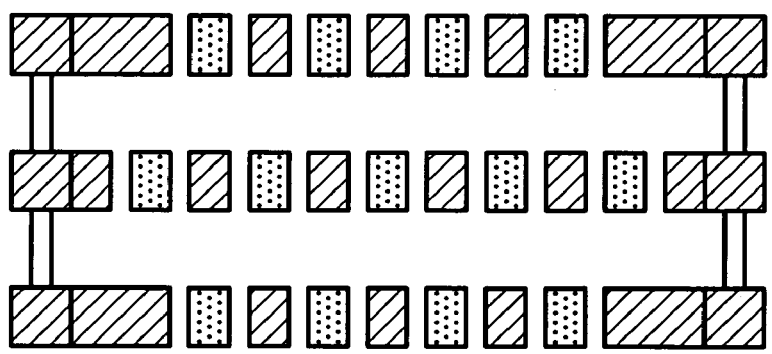
FIG. 9B is a cross section of the 3-level interdigitized capacitor in FIG. 9A along a dashed line A-A'

FIG. 8A is a top view of a 3-level interdigitized capacitor according to the second embodiment of the invention and FIG. 8B a cross section of the 3-level interdigitized capacitor in FIG. 8A along a dashed line A-A'. FIG. 9A is a top view of the 3-level interdigitized capacitor in FIG. 8A rotated by 90° and FIG. 9B a cross section of the 3-level interdigitized capacitor in FIG. 9A along a dashed line A-A'.

Figure 10A:
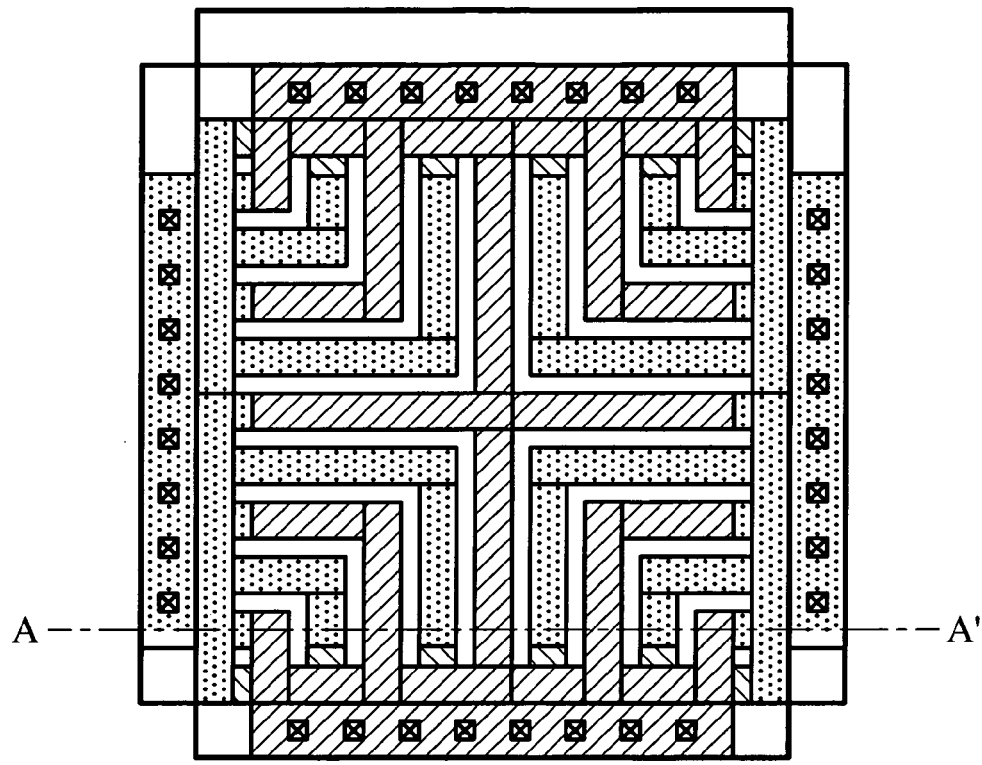
FIG. 10A is a top view of an integrated stacked capacitor 600 according to a third embodiment of the invention.
Figure 10B:
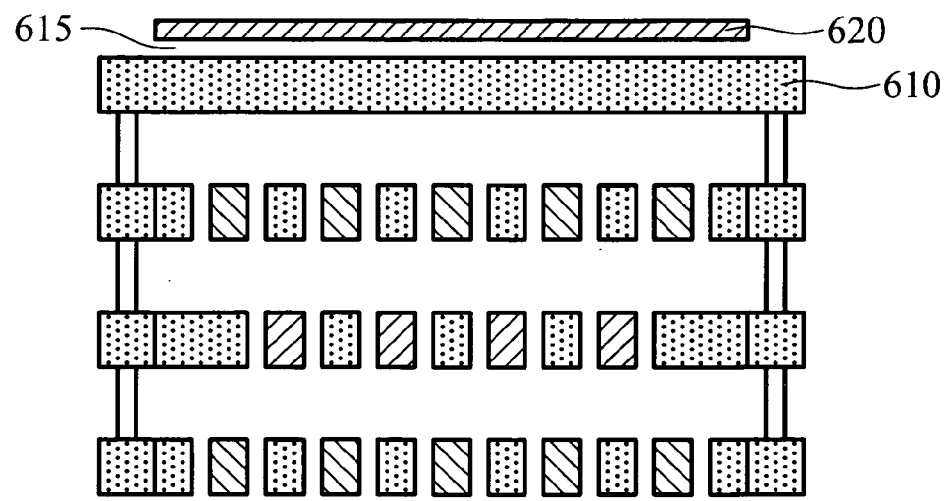
FIG. 10B is a cross section of the integrated stacked capacitor 600 in FIG. 10A along a dashed line A-A'.
Figure 11A:
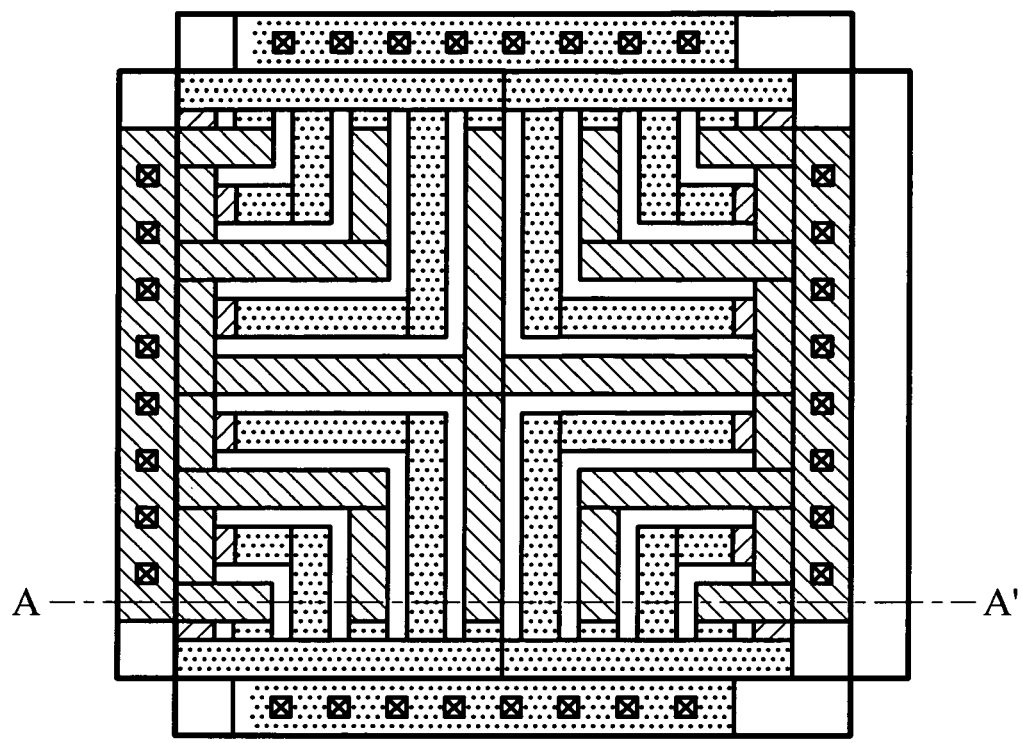
FIG. 11A is a top view of the integrated stacked capacitor 600 in FIG. 10A rotated by 90 degrees.
Figure 11B:
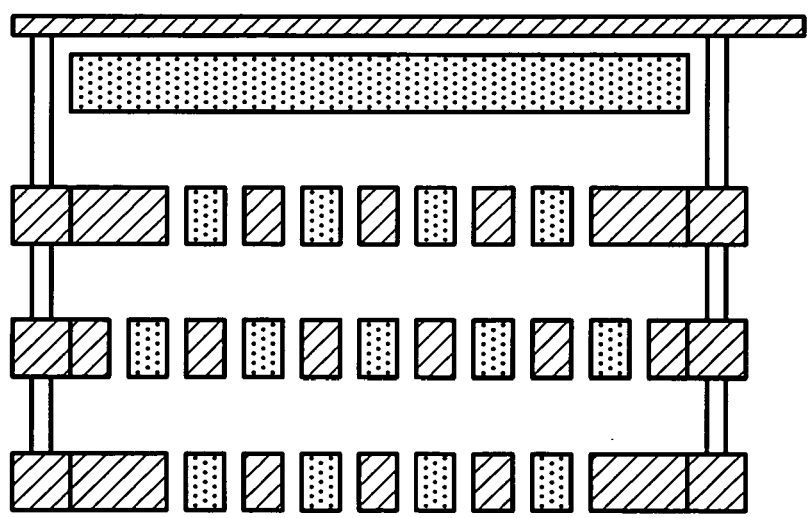
FIG. 11B a cross section of the integrated stacked capacitor in FIG. 11A along a dashed line A-A'.

To increase capacitance density, the invention provides an integrated stacked capacitor. FIG. 10A is a top view of an integrated stacked capacitor 600 according to a third embodiment of the invention and FIG. 10B a cross section of the integrated stacked capacitor 600 in FIG. 10A along a dashed line A-A'. When the interdigitized capacitor according to the first embodiment of the invention is formed with a top metal layer, there is a lower limit in spacing between metal lines depending on the design rules of process and coupling efficiency thereof is thus limited. Accordingly, a MIM capacitor is used in the integrated interdigitized capacitor as shown in FIG. 10B. The MIM capacitor comprises a top metal 610 and another metal layer 620. A dielectric layer 615 is sandwiched by the electrode plates. The MIM capacitor is connected to the stacked capacitor according to the second embodiment of the invention in parallel and an integrated stacked capacitor is thus formed, providing higher capacitance density. FIG. 11A is a top view of the integrated stacked capacitor 600 in FIG. 10A rotated by 90° and FIG. 11B a cross section of the integrated stacked capacitor in FIG. 11A along a dashed line A-A'.

Figure 12A:
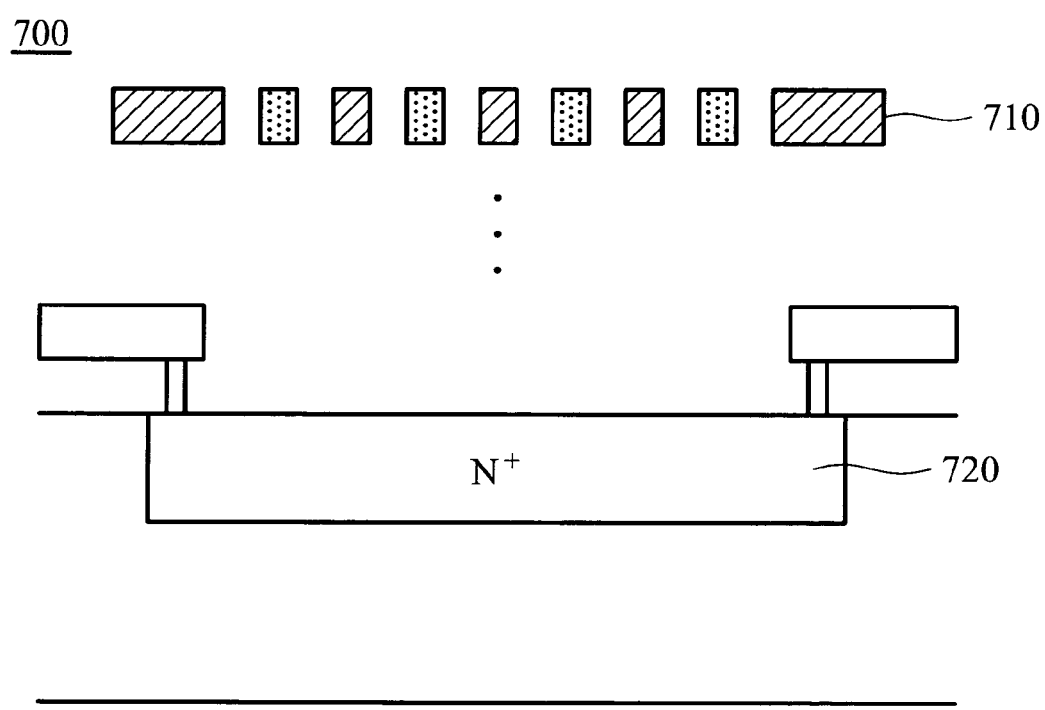
FIG. 12A is a cross section of a stacked configuration with an interdigitized capacitor according to an embodiment of the invention.
Figure 12B:
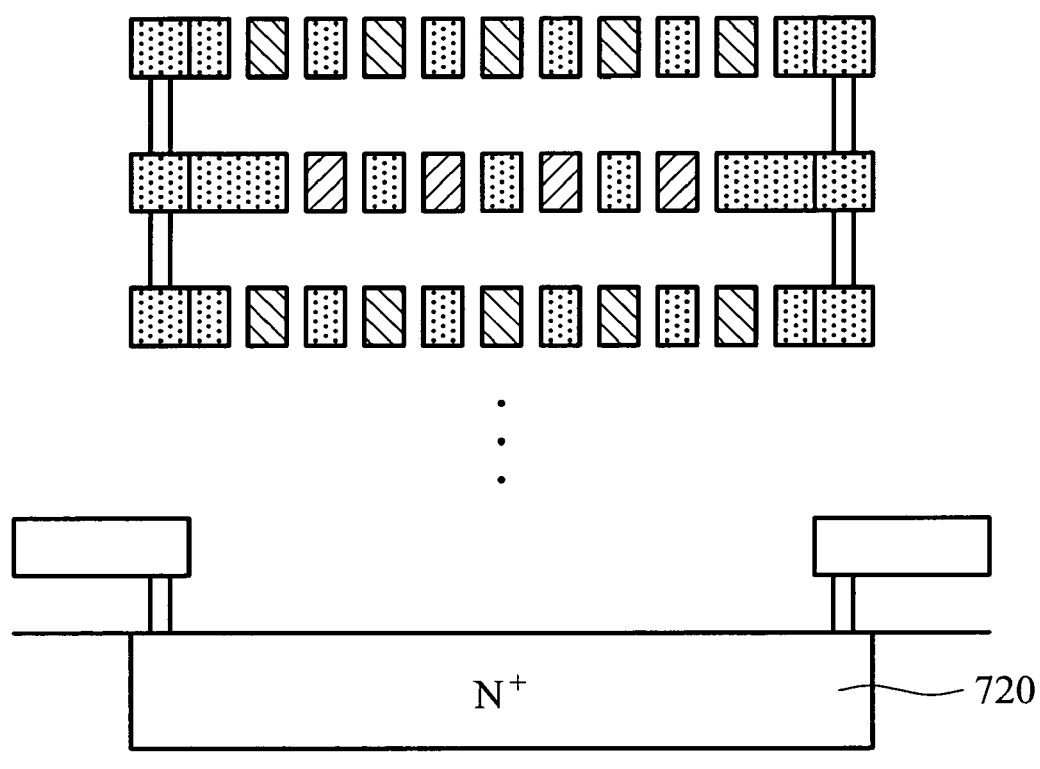
FIG. 12B is a cross section of a stacked configuration with a stacked capacitor according to an embodiment of the invention.
Figure 12C:
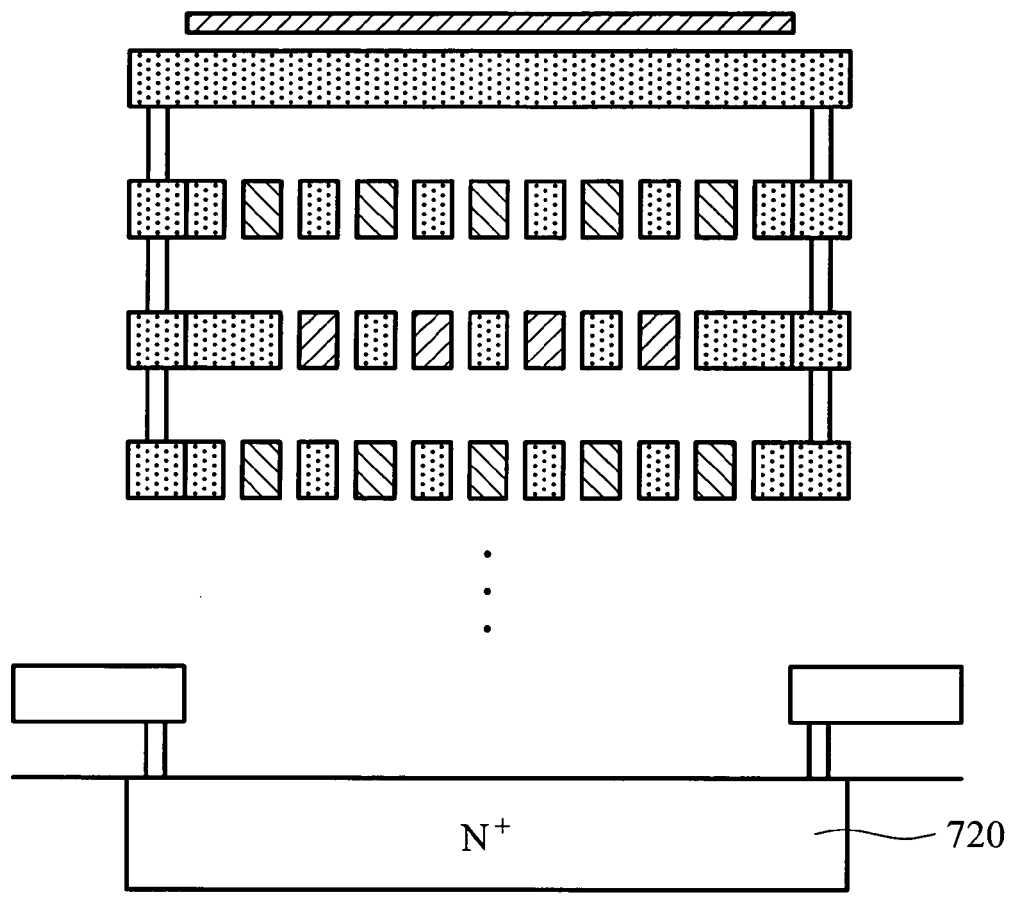
FIG. 12C is a cross section of a stacked configuration with an integrated stacked capacitor according to an embodiment of the invention.

The invention also provides a stacked configuration with an interdigitized capacitor. FIG. 12A is a cross section of the stacked configuration. The stacked configuration 700 comprises an interdigitized capacitor 710 and a device 720. The device is located under the interdigitized capacitor 710. The device can be a resistor, a diode, a bipolar junction transistor (BJT), a metal-oxide-semiconductor (MOS) transistor or the like. Thus, silicon area is utilized more efficiently. It is noted that the interdigitized capacitor can also be replaced by the stacked capacitor or the integrated stacked capacitor, as shown in FIGS. 12B and 12C.

Figure 13A:
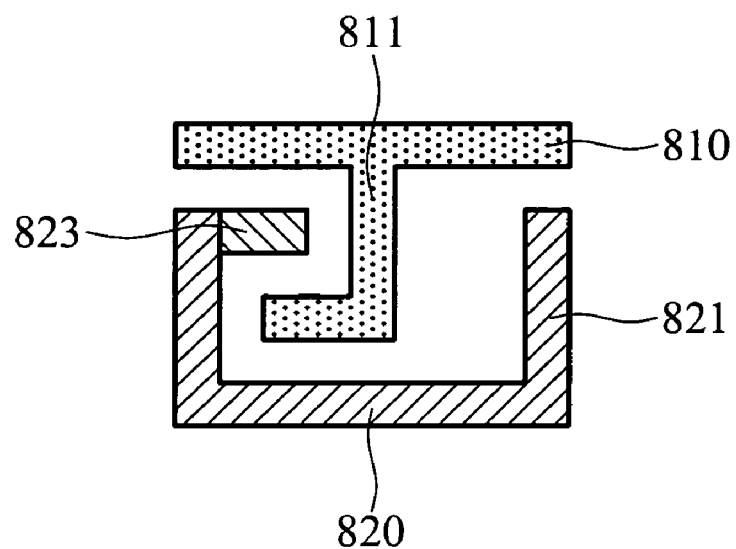
FIGS. 13A and 13B are schematic diagrams of an interdigitized capacitor according to an embodiment of the invention.
Figure 13B:
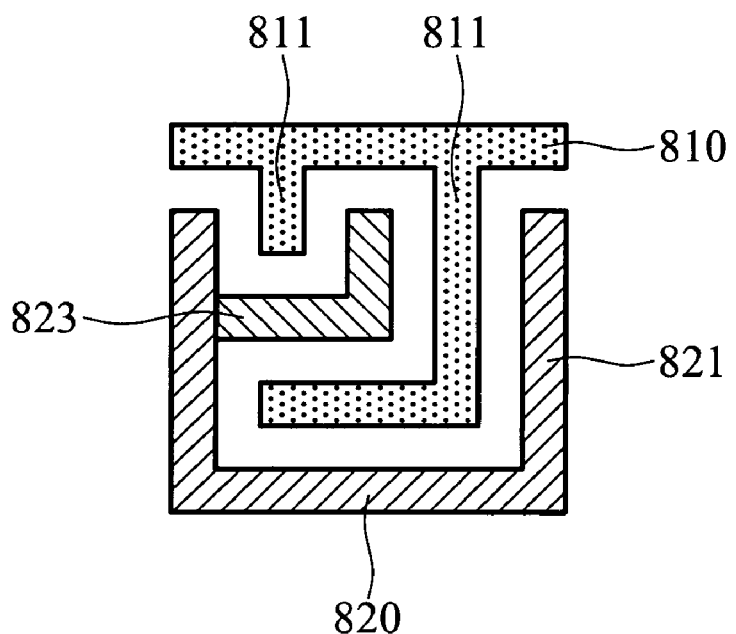

The invention also provides an interdigitized capacitor as shown in FIGS. 13A and 13B. The interdigitized capacitor comprises a first electrode 810 and a second electrode 820. The first electrode 810 comprises at least one finger 811. The second electrode 820 comprises a U-shaped conducting plate 821. The U-shaped conducting plate comprises at least one finger 823. The fingers of the first and second electrodes are interdigitized. In addition, the fingers of the first and second electrodes can be linear or bent.

Figure 14A:
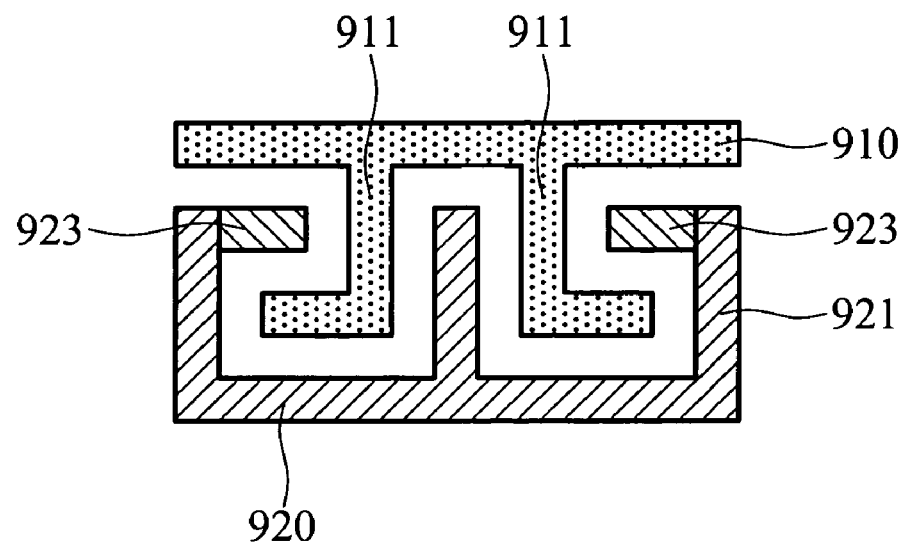
FIGS. 14A and 14B are schematic diagrams of an interdigitized capacitor according to an embodiment of the invention.
Figure 14B:
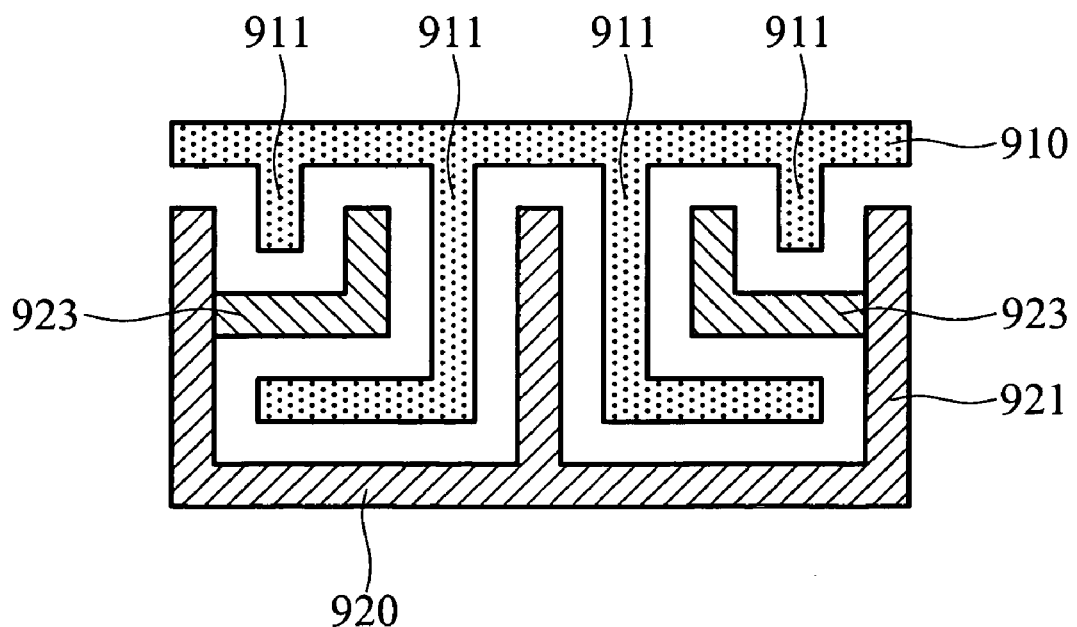

The invention also provides an interdigitized capacitor as shown in FIGS. 14A and 14B. The interdigitized capacitor comprises a first electrode 910 and a second electrode 920. The first electrode 910 comprises at least two fingers 911. The second electrode 920 comprises an E-shaped conducting plate 921. The E-shaped conducting plate comprises at least two fingers 923. The fingers of the first and second electrodes are interdigitized. In addition, the fingers of the first and second electrodes can be linear or bent.

Figure 15A:
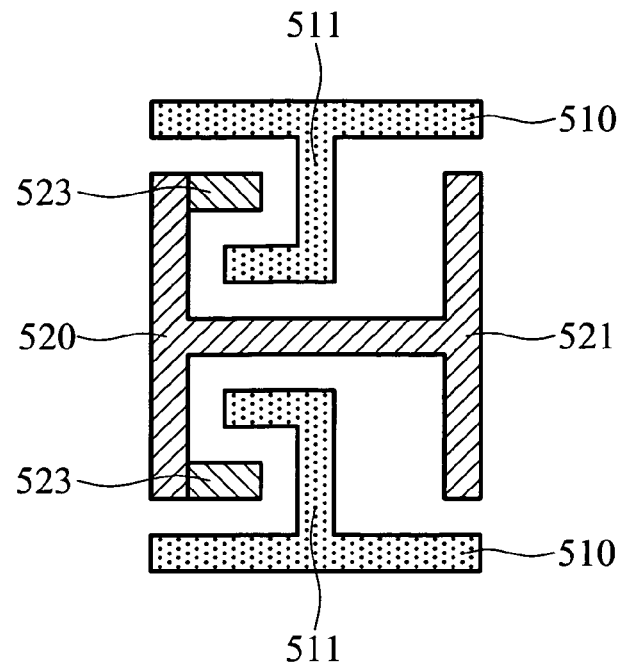
FIGS. 15A and 15B are schematic diagrams of an interdigitized capacitor according to an embodiment of the invention.
Figure 15B:
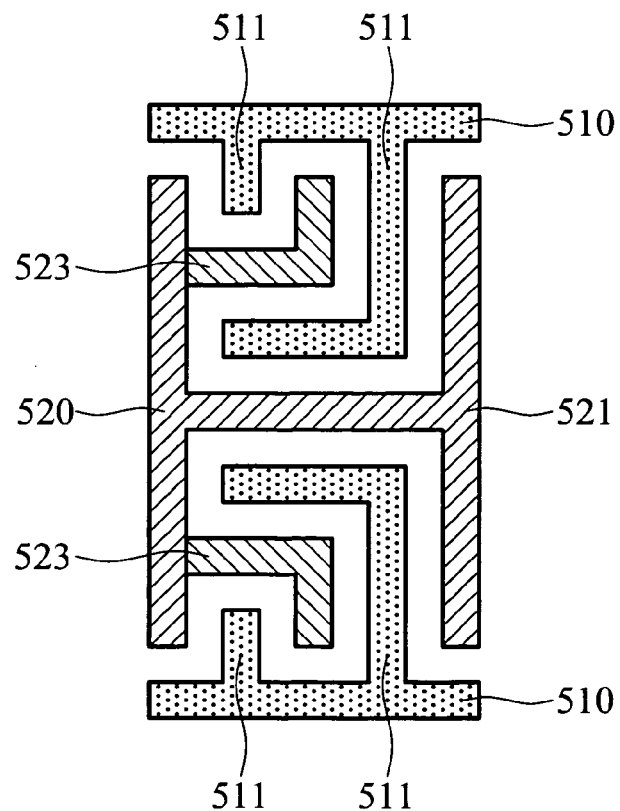

The invention also provides an interdigitized capacitor as shown in FIGS. 15A and 15B. The interdigitized capacitor comprises a first electrode 510 and a second electrode 520. The first electrode 510 comprises at least two fingers 511. The second electrode 520 comprises an H-shaped conducting plate 521. The H-shaped conducting plate comprises at least two fingers 523. The fingers of the first and second electrodes are interdigitized. In addition, the fingers of the first and second electrodes can be linear or bent.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An interdigitized capacitor, comprising:
   a first electrode having two combs with mirror symmetry across a first mirror plane, wherein fingers of the combs extend toward the first mirror plane;
   a second electrode having two combs with mirror symmetry across a second mirror plane and a linear plate located on the second mirror plane, wherein fingers of the combs extend toward the second mirror plane and one of the fingers in each comb is connected with the linear plate;
   wherein the first and second mirror planes are orthogonal and the fingers of the first and second electrodes are interdigitized.

2. The interdigitized capacitor as claimed in claim 1, wherein a region occupied by the interdigitized capacitor is a square.

3. The interdigitized capacitor as claimed in claim 1, wherein at least two of the fingers in each comb of the first electrode are bent.

4. An integrated stacked capacitor comprising a plurality of the interdigitized capacitors as claimed in claim 2, wherein the interdigitized capacitors are stacked and have the same structure, the first mirror plane of each interdigitized capacitor being parallel to the second mirror plane of the adjacent interdigitized capacitor, and the second mirror plane of each interdigitized capacitor being parallel to the first mirror plane of the adjacent interdigitized capacitor, wherein the polarities of the first and second electrodes of the adjacent interdigitized capacitor are exchanged.

5. An integrated stacked capacitor comprising a plurality of the interdigitized capacitors as claimed in claim 2 and a MIM capacitor, wherein the interdigitized capacitors are stacked and have the same structure, and the stacked interdigitized capacitors are connected in parallel with the MIM capacitor, wherein the first mirror plane of each interdigitized capacitor is parallel to the second mirror plane of the adjacent interdigitized capacitor and the second mirror plane of each interdigitized capacitor is parallel to the first mirror plane of the adjacent interdigitized capacitor, wherein the polarities of the first and second electrodes of the adjacent interdigitized capacitor are exchanged.

* * * * *